(12) United States Patent
Colbert et al.

(10) Patent No.: US 7,486,516 B2
(45) Date of Patent: Feb. 3, 2009

(54) MOUNTING A HEAT SINK IN THERMAL CONTACT WITH AN ELECTRONIC COMPONENT

(75) Inventors: John Lee Colbert, Byron, MN (US); Eric Alan Eckberg, Rochester, MN (US); Roger Duane Hamilton, Rochester, MN (US); Mark Kenneth Hoffmeyer, Rochester, MN (US); Amanda Elisa Ennis Mikhail, Rochester, MN (US); Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 559 days.

(21) Appl. No.: 11/201,972

(22) Filed: Aug. 11, 2005

(65) Prior Publication Data

US 2007/0035937 A1     Feb. 15, 2007

(51) Int. Cl.
*H05K 7/20* (2006.01)
(52) U.S. Cl. ............... 361/710; 361/704; 257/718; 439/71
(58) Field of Classification Search ........... 361/704, 361/710, 719, 769; 439/71, 485; 165/80.3, 165/121, 185; 257/713, 727, 718–719, 704; 438/106; 29/832; 428/548; 174/16.3, 541
See application file for complete search history.

(56) References Cited

U.S. PATENT DOCUMENTS

| | | | |
|---|---|---|---|
| 4,748,495 A * | 5/1988 | Kucharek | 257/713 |
| 5,730,620 A * | 3/1998 | Chan et al. | 439/526 |
| 5,738,531 A * | 4/1998 | Beaman et al. | 439/71 |
| 5,770,891 A * | 6/1998 | Frankeny et al. | 257/727 |
| 5,870,286 A | 2/1999 | Butterbaugh et al. | |
| 5,978,223 A | 11/1999 | Hamilton et al. | |
| 6,198,630 B1 * | 3/2001 | Cromwell | 361/704 |
| 6,261,404 B1 | 7/2001 | Baska et al. | |
| 6,330,745 B1 * | 12/2001 | Cromwell et al. | 29/832 |
| 6,385,044 B1 | 5/2002 | Colbert et al. | |
| 6,415,853 B1 * | 7/2002 | Tao et al. | 165/80.3 |
| 6,442,026 B2 * | 8/2002 | Yamaoka | 361/704 |
| 6,449,155 B1 | 9/2002 | Colbert et al. | |
| 6,639,800 B1 * | 10/2003 | Eyman et al. | 361/704 |
| 6,724,629 B1 * | 4/2004 | Augustin et al. | 361/704 |
| 6,836,408 B2 | 12/2004 | Gektin et al. | |
| 6,930,884 B2 * | 8/2005 | Cromwell et al. | 361/710 |
| 6,950,310 B2 * | 9/2005 | Edwards | 361/721 |

(Continued)

*Primary Examiner*—Jayprakash N Gandhi
*Assistant Examiner*—Courtney L Smith
(74) *Attorney, Agent, or Firm*—Matthew J. Bussan

(57) ABSTRACT

A heat transfer apparatus comprises a load frame having load springs and an open region that exposes an electronic component. The load frame is mounted to a printed circuit board on which the electronic component is mounted. A heat sink assembly is disposed on the load frame and has a main body in thermal contact with the electronic component through a thermally conductive material. The heat sink assembly has load arms for engaging the load springs. A load plate extends between the load arms and has an actuation element operative to displace the main body relative to the load plate and thereby resiliently deform the load springs and produce a load force that compresses the thermally conductive material to achieve a desired thermal interface gap between the main body and the electronic component. Non-influencing fasteners secure the heat sink to the load frame and maintain the desired thermal interface gap.

2 Claims, 7 Drawing Sheets

U.S. PATENT DOCUMENTS

| | | | |
|---|---|---|---|
| 7,323,358 B1 * | 1/2008 | Cromwell | 438/106 |
| 7,327,573 B2 * | 2/2008 | Lee et al. | 361/704 |
| 2003/0192180 A1 * | 10/2003 | Colbert et al. | 29/836 |
| 2004/0038583 A1 * | 2/2004 | Peterson et al. | 439/485 |
| 2004/0247925 A1 * | 12/2004 | Cromwell | 428/548 |
| 2005/0006055 A1 | 1/2005 | Colbert et al. | |
| 2005/0122691 A1 | 6/2005 | Crippen et al. | |
| 2007/0086168 A1 * | 4/2007 | Khanna et al. | 361/719 |
| 2008/0081489 A1 * | 4/2008 | MacGregor et al. | 439/71 |

* cited by examiner

MOUNTING A HEAT SINK IN THERMAL CONTACT WITH AN ELECTRONIC COMPONENT

BACKGROUND OF THE INVENTION

1. Field of Invention

The present invention relates in general to the field of electronic packaging, and in particular to electronic packaging that removes heat from an electronic component.

2. Background Art

Electronic components, such a microprocessors and integrated circuits, must operate within certain specified temperature ranges to perform efficiently. Excessive heat degrades electronic component performance, reliability, life expectancy, and can even cause failure. Heat sinks are widely used for controlling excessive heat. Typically, heat sinks are formed with fins, pins or other similar structures to increase the surface area of the heat sink and thereby enhance heat dissipation as air passes over the heat sink. In addition, it is not uncommon for heat sinks to contain high performance structures, such as vapor chambers and/or heat pipes, to further enhance heat transfer. Heat sinks are typically formed of metals, such as copper or aluminum. More recently, graphite-based materials have been used for heat sinks because such materials offer several advantages, such as improved thermal conductivity and reduced weight.

Electronic components are generally packaged using electronic packages (i.e., modules) that include a module substrate to which the electronic component is electronically connected. In some cases, the module includes a cap (i.e., a capped module) which seals the electronic component within the module. In other cases, the module does not include a cap (i.e., a bare die module).

Bare die modules are generally preferred over capped modules from a thermal performance perspective. In the case of a capped module, a heat sink is typically attached with a thermal interface between a bottom surface of the heat sink and a top surface of the cap, and another thermal interface between a bottom surface of the cap and a top surface of the electronic component. In the case of a bare die module, a heat sink is typically attached with a thermal interface between a bottom surface of the heat sink and a top surface of the electronic component. Bare die modules typically exhibit better thermal performance than capped modules because bare die modules eliminate two sources of thermal resistance present in capped modules, i.e., the thermal resistance of the cap and the thermal resistance of the thermal interface between the cap and the electronic component. Accordingly, bare die modules are typically used to package electronic components that require high total power dissipation.

Heat sinks are attached to modules using a variety of attachment mechanisms, such as clamps, screws, and other hardware. The attachment mechanism typically applies a force that maintains a thermal interface gap, i.e., the thickness of the thermal interface extending between the heat sink and the module. In the case of a capped module, the cap protects the electronic component from physical damage from the applied force. In the case of a bare die module, however, the applied force is transferred directly through the electronic component itself. Consequently, when bare die modules are used, the attachment mechanism typically applies a compliant force to decrease stresses on the electronic component.

FIG. 1 illustrates an example of a prior art attachment mechanism for attaching a heat sink to a bare die module using a compliant force. A circuit board assembly 100 includes a printed circuit board 105 and a bare die module 110. Bare die module 110 includes a module substrate 115, an electronic component such as a semiconductor chip 120, and an electronic connection 125. Semiconductor chip 120 is electrically connected to module substrate 115. Electronic connection 125, which electrically connects printed circuit board 105 to module substrate 115, may be a pin grid array (PGA), a ceramic column grid array (CCGA), a land grid array (LGA), or the like. Semiconductor chip 120 is thermally connected with a heat sink 130 through a thermal interface 135, which is a layer of thermally conductive material such as thermal paste, oil, or other high thermal conductivity material. Typically, the thermal interface 135 is relatively thin so that it may easily transfer heat away from bare die module 110 and toward heat sink 130. The thickness of thermal interface 135 extending between heat sink 130 and semiconductor chip 120 is referred to as the thermal interface gap.

Heat sink 130 is attached to bare die module 110 using bolts 140. Bolts 140 pass through thru-holes 131 in heat sink 130 and thru-holes 106 in printed circuit board 105 and are threaded into threaded-holes 146 in a backside bolster 145. Typically, bolts 140 are arranged one at each corner of the electronic component 120, or one on each side of the electronic component 120. Bolts 140 are tightened by threading a threaded portion of bolts 140 into threaded-holes 146 in backside bolster 145. As bolts 140 are tightened, heat sink 130 engages semiconductor chip 120 through thermal interface 135. Additional tightening of bolts 140 causes deflection of printed circuit board 105 which applies a compliant force to bare die module 110. More particularly, printed circuit board 105 is slightly flexed in a concave-arc fashion with respect to bare die module 110.

Unfortunately, deflection of printed circuit board 105 will not always provide the necessary compliance to decrease stresses on electronic component 120. Problems may arise with this board deflection approach if, for example, printed circuit board 105 has a relatively thick cross-section and/or bare die module 110 has a relatively large area (i.e., the "footprint" occupied by bare die module 110 on printed circuit board 105). Printed circuit boards of relatively thick cross-section are typically less compliant than printed circuit boards of thinner cross-section. Consequently, the necessary compliance often cannot be achieved by deflecting relatively thick cross-section printed circuit boards. Moreover, the resulting stresses on the printed circuit board upon deflection can lead to catastrophic failure of solder joints and conductor traces on the printed circuit board. In addition, if the bare die module has a relatively large area, the concave-arc that results upon deflection of the printed circuit board can put the solder joints of the bare die module under unacceptable tension stresses.

SUMMARY OF THE INVENTION

The present invention provides an enhanced mounting mechanism for holding a heat sink in thermal contact with an electronic component in a manner substantially without negative effect and that overcomes many of the disadvantages of prior art arrangements.

In accordance with one aspect of the present invention, provision is made for a heat transfer apparatus comprising: a printed circuit board having an electronic component thereon; a load frame mounted to the printed circuit board, the load frame having an open region into which the electronic component extends exposing a surface of the electronic component, and the load frame having a plurality of load springs mounted thereon; a heat sink assembly disposed on the load frame and having a main body with a surface in thermal contact with the surface of the electronic component through a thermally conductive material, the heat sink assembly having a plurality of load arms, each load arm having a hook for engaging one of the load springs; and, a load plate extending between the load arms, the load plate having an actuation element operative to displace the main body relative to the load plate and thereby resiliently deform the load springs and produce a load force that compresses the thermally conductive material to achieve a desired thermal interface gap between the surface of the main body and the surface of the electronic component.

In accordance with another aspect of the present invention, provision is made for a method of assembling a heat transfer apparatus, comprising the steps of: attaching a load frame to a printed circuit board having an electronic component thereon, the load frame having an open region into which the electronic component extends exposing a surface of the electronic component, and the load frame having a plurality of load springs mounted thereon respectively configured to receive a plurality of hooks of a plurality of load arms of a heat sink assembly; dispensing a thermally conductive material on the surface of the electronic component; placing the heat sink assembly on the load frame so that the hooks of the load arms of the heat sink assembly engage the load springs of the load frame and so that a surface of the main body of the heat sink assembly is in thermal contact with the surface of the electronic component through the thermally conductive material; and, actuating an actuation element of a load plate extending between the load arms of the heat sink assembly to displace the main body relative to the load plate and thereby resiliently deform the load springs and produce a load force that compresses the thermally conductive material to achieve a desired thermal interface gap between the surface of the main body and the surface of the electronic component.

In accordance with yet another aspect of the present invention, provision is made for a heat transfer apparatus comprising: a printed circuit board having an electronic component thereon; a load frame mounted to the printed circuit board, the load frame having an open region into which the electronic component extends exposing a surface of the electronic component; a heat sink disposed on the load frame and having a surface in thermal contact with the surface of the electronic component through a thermally conductive material; an actuation mechanism to apply a preload force to the heat sink toward the electronic component to compress the thermally conductive material and achieve a desired thermal interface gap between the surface of the heat sink and the surface of the electronic component; and, at least one non-influencing fastener disposed within a bore of the heat sink and threaded into the load frame to secure the heat sink to the load frame and maintain the desired thermal interface gap.

In accordance with still another aspect of the present invention, provision is made for a method of assembling a heat transfer apparatus, comprising the steps of: attaching a load frame to a printed circuit board having an electronic component thereon, the load frame having an open region into which the electronic component extends exposing a surface of the electronic component; dispensing a thermally conductive material on the surface of the electronic component; placing a heat sink on the load frame so that a surface of the heat sink is in thermal contact with the surface of the electronic component through the thermally conductive material; applying a preload force to the heat sink toward the electronic component to compress the thermally conductive material and achieve a desired thermal interface gap between the surface of the heat sink and the surface of the electronic component; and, actuating at least one non-influencing fastener disposed within a bore of the heat sink and threaded into the load frame to secure the heat sink to the load frame and maintain the desired thermal interface gap.

BRIEF DESCRIPTION OF THE DRAWINGS

The preferred exemplary embodiments of the present invention will hereinafter be described in conjunction with the appended drawings, where like designations denote like elements.

DETAILED DESCRIPTION OF THE PREFERRED EMBODIMENTS

1. Overview

In accordance with the preferred embodiments of the present invention, a heat transfer apparatus comprises a load frame having load springs and an open region that exposes an electronic component. The load frame is mounted to a printed circuit board on which the electronic component is mounted. A heat sink assembly is disposed on the load frame and has a main body in thermal contact with the electronic component through a thermally conductive material. The heat sink assembly has load arms for engaging the load springs. A load plate extends between the load arms and has an actuation element operative to displace the main body relative to the load plate and thereby resiliently deform the load springs and produce a load force that compresses the thermally conductive material to achieve a desired thermal interface gap between the main body and the electronic component. Non-influencing fasteners secure the heat sink to the load frame and maintain the desired thermal interface gap.

2. Detailed Description

Figure 1:
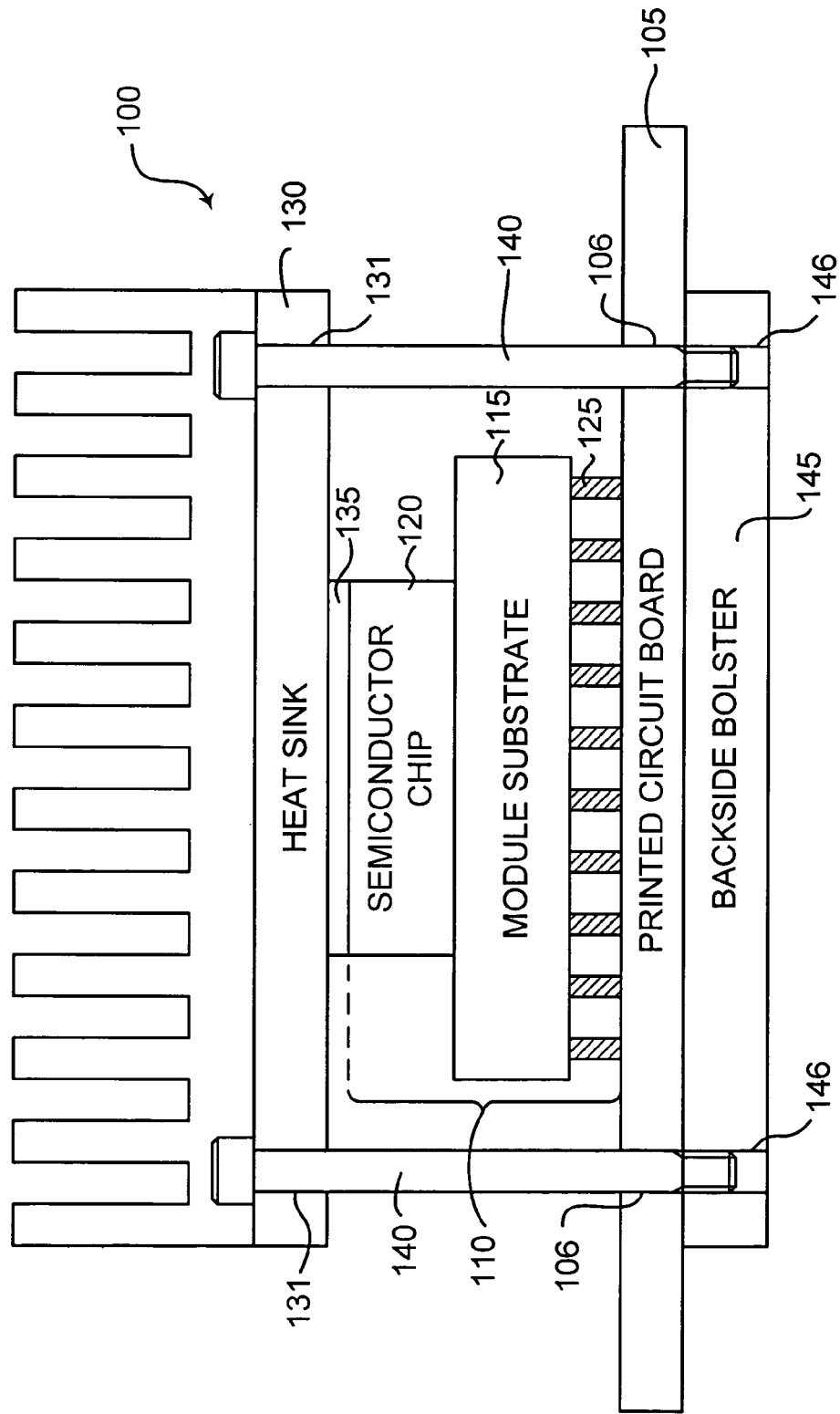
FIG. 1 illustrates an example of a prior art attachment mechanism for attachment of a heat sink to a bare die module.
Figure 2:
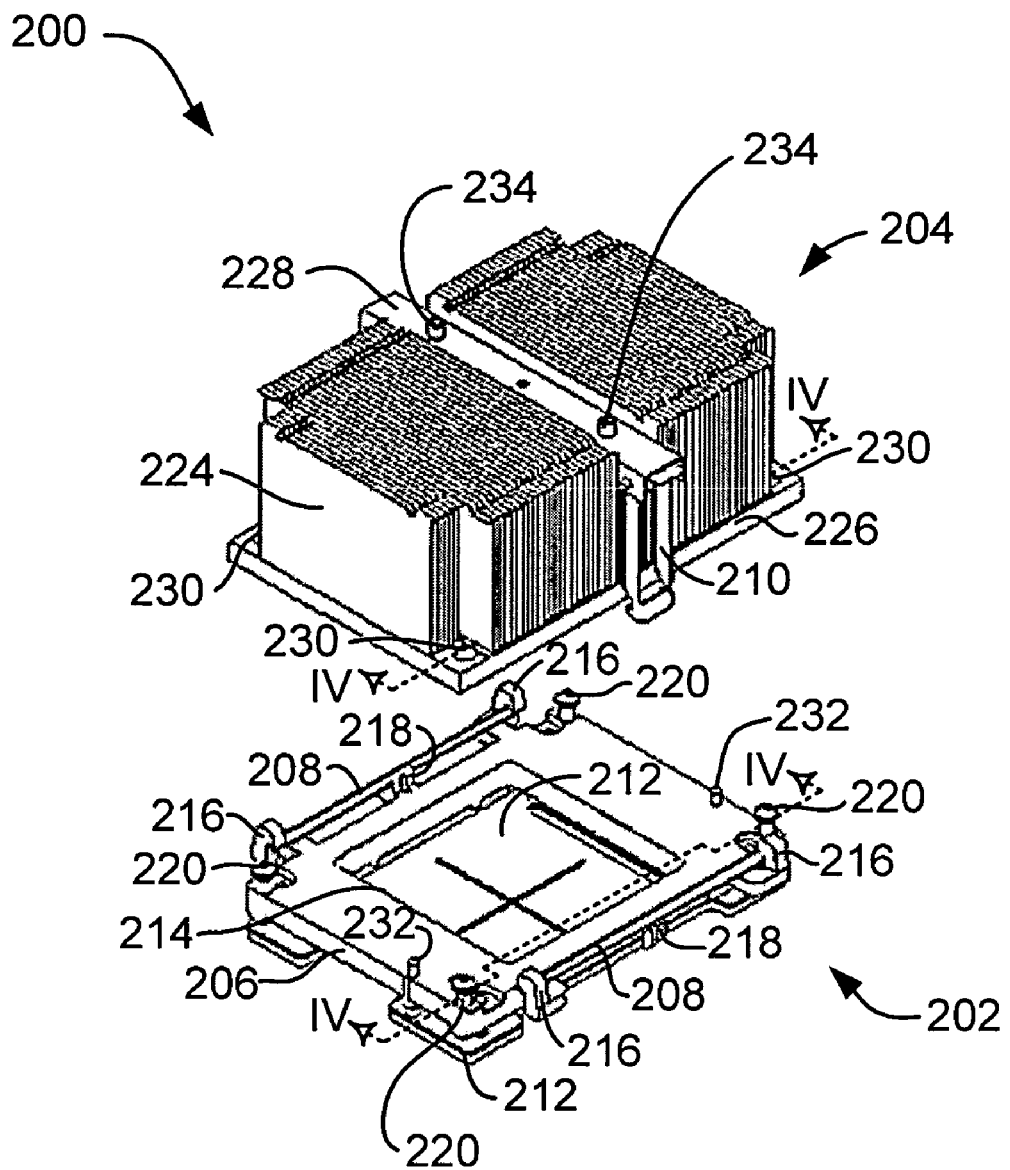
FIG. 2 is an exploded perspective view of a heat transfer apparatus in accordance with the preferred embodiments of the present invention.
Figure 3:
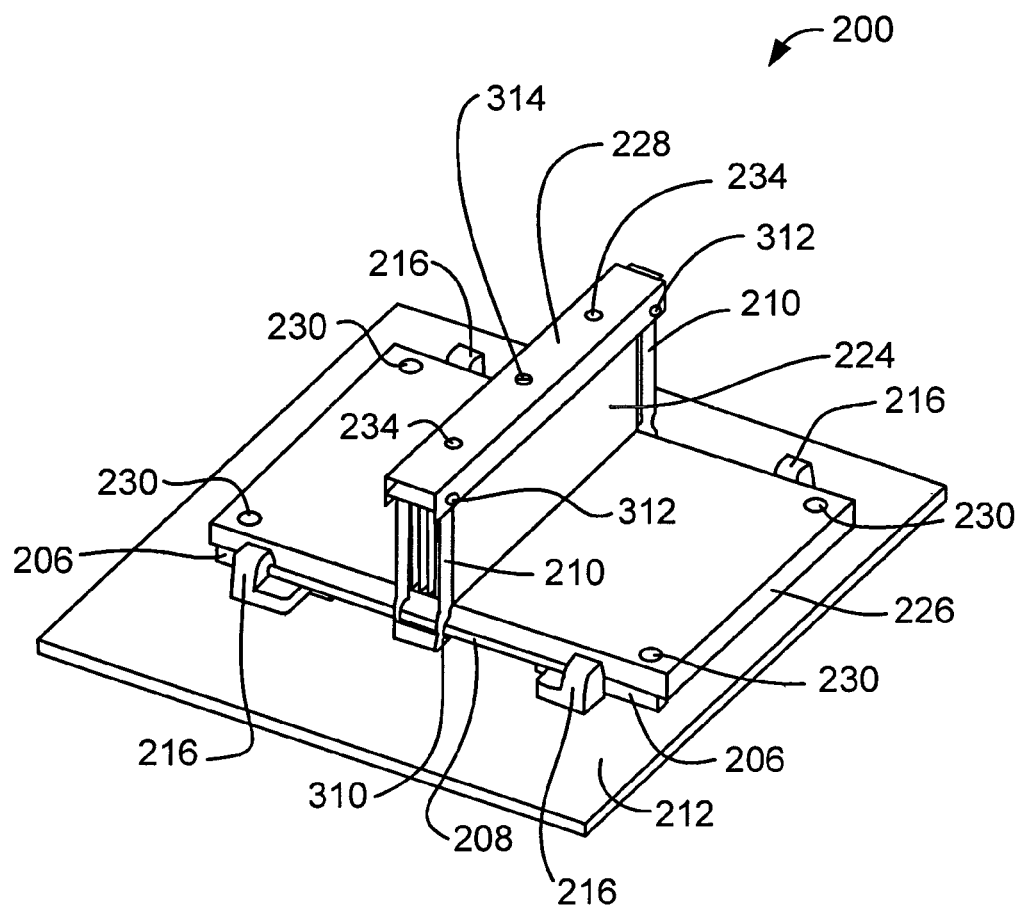
FIG. 3 is a perspective view of a heat transfer apparatus shown in FIG. 2 with portions of the heat sink removed.
Figure 4:
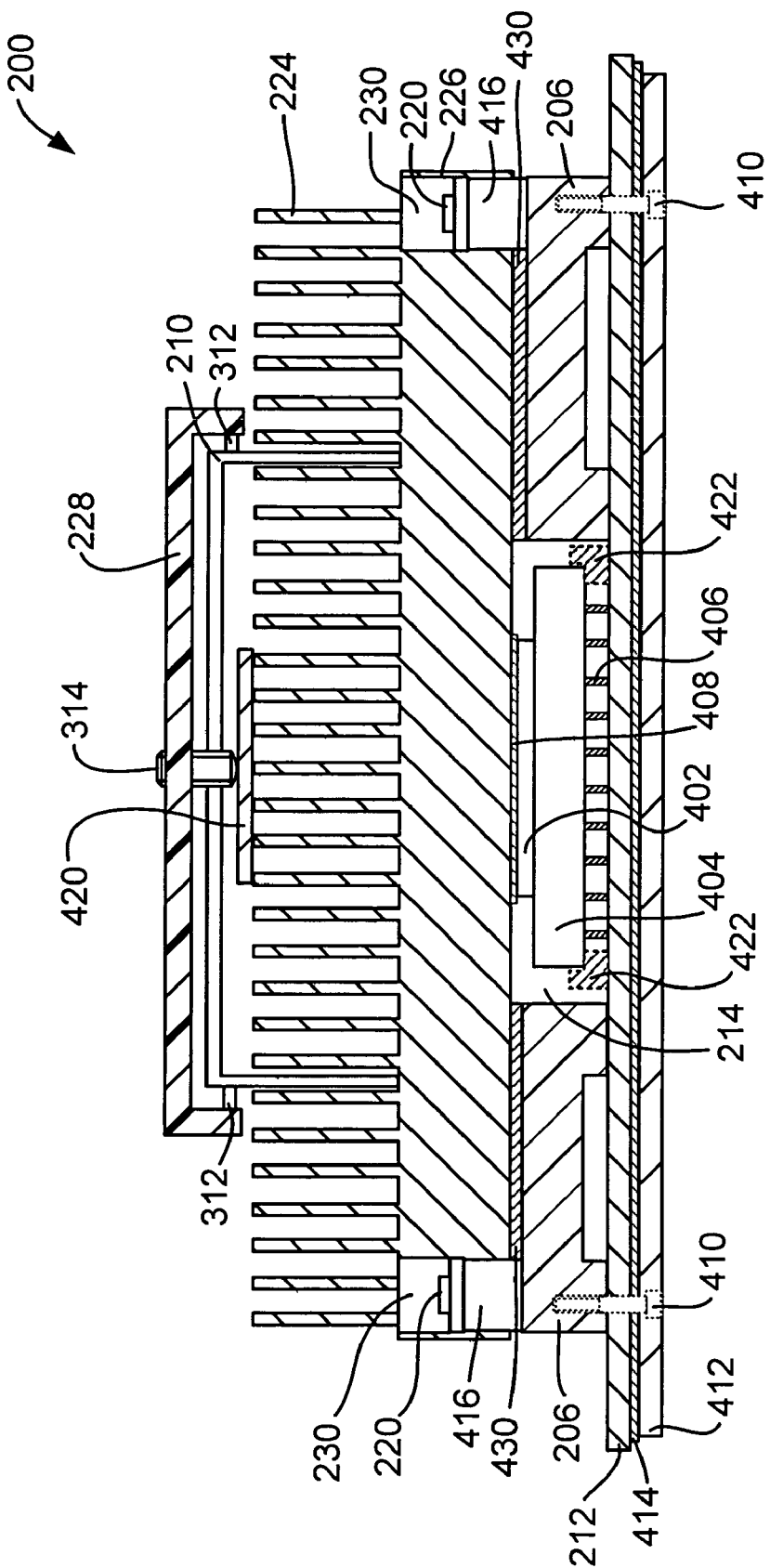
FIG. 4 is a cross-sectional view of a heat transfer apparatus shown in FIG. 2.

Reference is now made to FIGS. 2-4 for illustrating a heat transfer apparatus 200 in accordance with the preferred embodiments of the present invention, which implement an improved process for mounting a heat sink on a heat source, such as an electronic component. FIGS. 2-4 are intended to depict the representative major components of heat transfer apparatus 200 at a high level, it being understood that individual components may have lesser or greater complexity that represented in FIG. 2-4, and that the number, type and configuration of such components may vary. For example, heat transfer apparatus 200 may contain a different number, type and configuration of heat sources (e.g., electrical components) than shown.

As best seen in FIG. 2, which is an exploded perspective view of heat transfer apparatus 200, heat transfer apparatus 200 comprises two main components, i.e., a load frame/spring assembly 202 and a heat sink/load arm assembly 204. Load frame/spring assembly 202 includes a load frame 206 and a pair of load springs 208. Load frame 206 is preferably made of an alloy material chosen for its low creep properties, such Zamak 8. Zamak 8, also known as ZA-8, is the trade name for a zinc-based alloy, the primary components of which are zinc, aluminum, copper, and magnesium. Creep is the development over time of additional strains in a material. Creep depends on the magnitude of the applied force and its duration, as well as the temperature and pressure. A material having high creep resistance is preferable in the construction of load frame 206 because creep deformation is to be avoided.

Load springs 208 are preferably made of an alloy material chosen for its high tensile strength properties, such as high strength music wire. Although two load springs 208 are shown in FIG. 2, those skilled in the art will appreciate that the present invention may be practiced with any number of load springs 208 (and load arms 210, which engage the load springs 208 as described below in the discussion of the heat sink/load arm assembly 204).

Load frame 206 is mounted on a printed circuit board 212. Referring now temporarily to FIG. 4, fasteners such as screws 410 (two of which are denoted with a dotted line in FIG. 4) are used to attach load frame 206 to printed circuit board 212. Screws 410 are denoted with a dotted line in FIG. 4 because they do not lie in the cross-section shown in FIG. 4. Preferably, four screws 410 (i.e., one near each corner of load frame 206) pass through thru-holes in a backside stiffener 412, an insulator 414 such as a polyimide, and printed circuit board 212, and are received in threaded holes in load frame 206. This configuration advantageously allows access to screws 410 even when the heat sink/load arm assembly is attached to the load frame/spring assembly.

Now returning to FIG. 2, load frame 206 includes one or more open regions 214 into which extends the heat source, e.g., an electronic component (not shown in FIG. 2) mounted on printed circuit board 212. For example, a bare die module may be mounted on printed circuit board 212 at the location designated at the intersection of the cross-hairs is shown in FIG. 2.

As shown in FIG. 2, load frame 206 includes four mounting projections 216 to which the ends of load springs 208 are secured. Load frame 206 also includes two downstop support projections 218 on which rest the mid-sections of load springs 208.

One or more non-influencing fasteners 220 are used to secure heat sink/load arm assembly 204 to load frame/load arm assembly 202. Preferably, four non-influencing fasteners 220 are mounted on load frame 206. Each of the non-influencing fasteners 220 is preferably threaded into a boss 416 (shown in FIG. 4) of load frame 206. The non-influencing fasteners (NIFs) lock the heat sink in position without influencing the position of the heat sink.

Heat sink/load arm assembly 204 includes a heat sink 224 having a base plate 226. Preferably, heat sink 224 is formed with fins, pins or other similar structures to increase the surface area of the heat sink and thereby enhance heat dissipation as air passes over the heat sink. It is also preferable for heat sink 224 to contain high performance structures, such as vapor chambers and/or heat pipes, to further enhance heat transfer. For example, heat sink 224 may contain one or more vapor chambers (not shown) filled with deionized water. Heat sink 224 may, for example, be formed of metals, such as copper or aluminum, or other materials, such as graphite-based materials.

As mentioned above, heat sink/load arm assembly 204 includes load arms 210. Load arms 210 are pivotally attached to a U-channel load plate 228. Load arms 210 and U-channel load plate 228 may be made of stainless steel, for example, and are preferably configured to provide minimal air flow impedance across the fins of heat sink 224. For example, load arms 210 preferably have an open area through which air may flow. When heat sink/load arm assembly 204 is attached to load frame/spring assembly 202, load arms 210 engage the load springs 208. This engagement is described in detail below in the discussion of the actuation mechanism with reference to FIGS. 3 and 4. In addition, when heat sink/load arm assembly 204 is attached to load frame/spring assembly 202, non-influencing fasteners 220 are received in bore holes 230 in the heat sink's base plate 226. This non-influencing fastener arrangement is described in detail below with reference to FIGS. 4-6. To aid in alignment of heat sink/load arm assembly 204 with respect to load frame/spring assembly 202, load frame 206 may include alignment pins 232 that are received in corresponding alignment holes (not shown) in the heat sink's base plate 226.

FIG. 3 is a perspective view of a heat transfer apparatus 200 with portions of heat sink 224 removed. FIG. 4 is a cross-sectional view of a heat transfer apparatus 200. As best seen with reference to FIGS. 3 and 4, an actuation mechanism applies a preload force to heat sink 224 toward a semiconductor chip 402 (shown in FIG. 4) to compress a thermally conductive material 408 (shown in FIG. 4) and achieve a desired thermal interface gap between heat sink 224 and semiconductor chip 402. The main components of the actuation mechanism include load frame 206, the load frame's mounting projections 216, load springs 208, load arms 210, the load arms' hook portions 310, hinge pins 312, U-channel load plate 228, actuation screw 314, push plate 420, the push plate's guide pins 234, heat sink 224, and the heat sink's base plate 226. Referring to FIG. 3 for the moment, load arms 210 each include a hook portion 310 that engages one of the load springs 208. Load arms 210 are pivotally attached to U-channel load plate 228 by hinge pins 312. An actuation screw 314 is threaded through U-channel load plate 228 to engage an underlying push plate 420 (shown in FIG. 4). Actuation screw 314 may be, for example, an M3 screw. Actuation screw 314 is accessible for actuation from the top of U-channel load plate 228. The distance between the U-channel plate and push plate 420 is adjusted by turning actuation screw 314. This provides a controlled rate of loading. Those skilled in the art will recognize that other actuation elements and techniques to provide a controlled rate of loading are possible within the scope of the present invention, such as camming, rocking and the like.

Still referring to FIG. 3, when the load frame/spring assembly and the heat sink/load arm assembly are brought together, hook portions 310 of load arms 210 are engaged with load springs 208, and the actuation mechanism is actuated by turning actuation screw 314 in a direction to increase the distance between U-channel load plate 228 and the underlying push plate 420 (shown in FIG. 4). Load springs 208 are deflected by actuation of the actuation mechanism. The geometric parameters of load springs 208, i.e., the span, cross-section profile, and diameter) are optimized for the allowable space within the application and the required resulting load. Force is transmitted through the heat sink's fins and base plate 226 onto the underlying semiconductor chip 402 (shown in FIG. 4). The force compresses a thermally conductive material 408 (shown in FIG. 4) and achieves a desired thermal interface gap between heat sink's base plate 226 and semiconductor chip 402.

Referring now to FIG. 4, push plate 420 is affixed to heat sink 224. For example, push plate 420 may be soldered to heat sink 224 using, for example, SAC 305 solder. Alternatively, push plate 420 may be affixed to heat sink 224 with a suitable adhesive, such as epoxy. Push plate 420 may be made of stainless steel, for example. Preferably, push plate 420 is affixed in a location directly above the heat source, with the width of U-channel load plate 228 and push plate 420 substantially capturing the footprint of the heat source. This provides centroid loading above the bare die module, and thus provides substantially no edge stresses on the die. As shown in FIG. 4, for example, push plate 420 is affixed to seven of the heat sink's fins that lie above semiconductor chip 402. Although not shown in FIG. 4, additional modules residing on printed circuit board 212 may be accommodated in open area 214 of load frame 206. In such a case, push plate 420 is preferably affixed in a location directly over the primary module, with the width of U-channel load plate 228 and push plate 420 substantially capturing the footprint of the primary module.

As best seen in FIGS. 2 and 3, push plate preferably includes guide pins 234 that extend through corresponding holes in U-channel load plate 228. The purpose of guide pins 234 is to align push plate 420 relative to U-channel load plate 228.

As shown in FIG. 4, in the preferred embodiments, the heat source is one or more bare die modules, each bare die module comprising an electronic component such as a semiconductor chip 402, a module substrate 404, and an electronic connector 406. However, those skilled in the art will appreciate that the present invention may be practiced using other types of heat sources such as one or more capped modules and/or other electronic components. The bare die module shown in FIG. 4 is a single-chip module (SCM); however, those skilled in the art will recognize that the spirit and scope of the present invention is not limited to SCMs. For example, those skilled in the art will recognize that the present invention may be practiced using one or more multi-chip modules (MCMs), or a combination of MCMs, SCMs and/or other electronic components/heat sources.

It is significant to note that the present invention allows a single heat transfer apparatus to accommodate one or more modules having different footprints. Previous solutions required qualification of individual modules based on differences in footprint. The present invention overcomes this drawback of the prior art.

The bare die module is conventional. Semiconductor chip 402 is electrically connected to module substrate 404. Electronic connector 406, which electrically connects printed circuit board 212 to module substrate 404, may be a pin grid array (PGA), a ceramic column grid array (CCGA), a land grid array (LGA), or the like.

In some cases, electronic connector 406 may be susceptible to being crushed by the force applied by the actuation mechanism. This is problematic not only from the perspective of possible damage to electronic connector 406, but also throws off the planarity of the stack (i.e., the module substrate 404 and semiconductor chip 402) relative to the heat sink's base plate which causes thermally conductive material 408 to form an uneven thermal interface gap. In such cases, one or more crush protection elements 422 (denoted with a dotted line in FIG. 4 due to the optional nature thereof) may be inserted along peripheral portions of module substrate 404 between the bottom of module substrate 404 and the top of printed circuit board 212. The crush protection elements 422 may be made of a material such as a polythermal plastic or the like.

Figure 7:
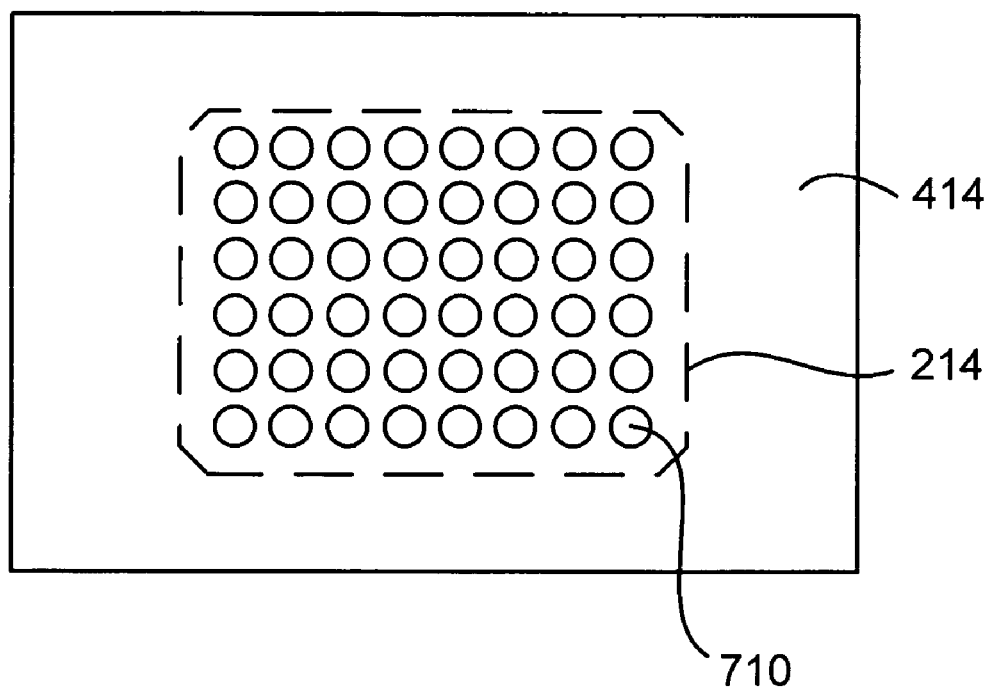
FIG. 7 is a top plan view of an insulator with an array of spherical dots according to a preferred embodiment of the present invention.

As shown in FIG. 7, additional crush protection may be utilized in the form of spherical dots 710 applied to insulator 414. Spherical dots 710 are made of a compliant material such as epoxy or the like, and are deposited on insulator 414 in an area that underlies the bare die module. For example, spherical dots 710 may be arranged in an array pattern adjacent to the edge of open region 214 of the load frame. The array pattern shown in FIG. 7 is exemplary, one skilled in the art will appreciate that numerous other array patterns are possible. The compliant nature of spherical dots 710 functions to improve planarity of the thermal interface gap formed by the thermally conductive material.

Referring back to FIG. 4, thermal interface 408 is made of a thermally conductive material such as thermal gel, grease, paste, oil, or other high thermal conductivity material. Preferably, thermal interface 408 is made of Shin-Etsu gel or grease with aluminum and/or zinc oxide spheres. Typically, thermal interface 408 is relatively thin so that it may easily transfer heat away from semiconductor chip 402 and toward the heat sink's base plate 226. The thickness of thermal interface 408 extending between the bottom of the heat sink's base plate 226 and the top surface of semiconductor chip 402 is referred to as the thermal interface gap. Preferably, the thermal interface gap is about 1.2 mil.

Thermally conductive material 408 is dispensed on semiconductor chip 402 prior to bringing the load frame/spring assembly and the heat sink/load arm assembly together. To protect semiconductor 402 as these assemblies are initially brought together, a viscoelastic foam pad 430 may be interposed between the lower surface of the heat sink's base plate 226 and the upper surface of load frame 206.

Those skilled in the art will appreciate that the actuation mechanism shown in FIGS. 3 and 4 is exemplary, and that other actuation mechanisms may be used to apply the preload force within the spirit and scope of the present invention. According to one embodiment of the present invention, once the preload force is applied to achieve the desired thermal gap, irrespective of the actuation mechanism that applied the preload force, one or more non-influencing fasteners are actuated to secure the heat sink to the load frame and maintain the desired thermal gap.

Figure 5:
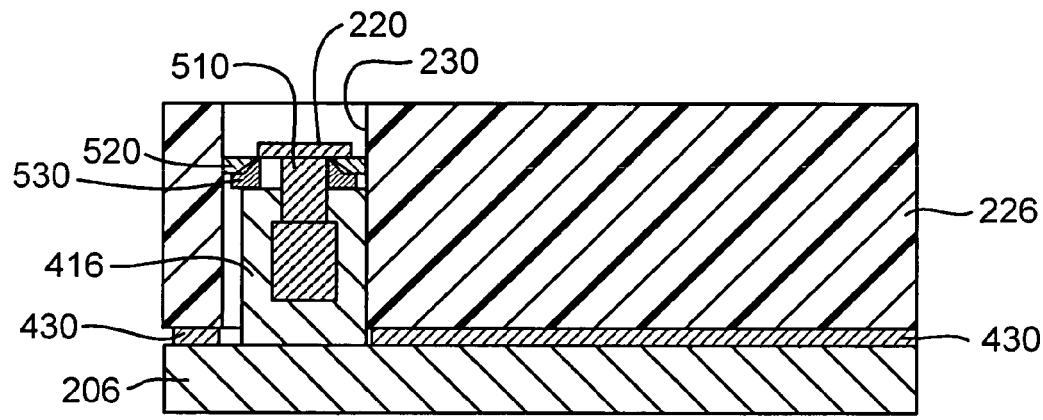
FIG. 5 is a cross-sectional view of a portion of the heat transfer apparatus shown in FIG. 2 showing a non-influencing fastener arrangement with a non-influencing fastener in an actuated state.
Figure 6:
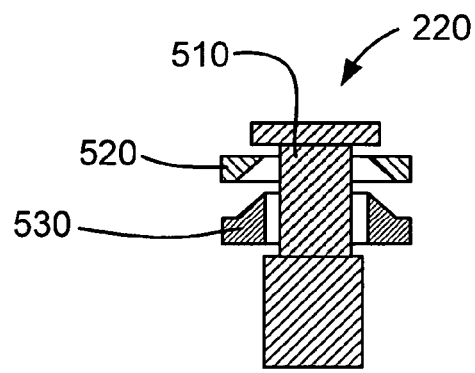
FIG. 6 is a cross-sectional view of a non-influencing fastener in a non-actuated state.

As shown in FIG. 4, when the heat sink/load arm assembly is attached to the load frame/spring assembly, non-influencing fasteners 220 are received in bore holes 230 in the heat sink's base plate 226. Once the actuation mechanism applies the preload force to achieve the desired thermal interface gap, non-influencing fasteners 220 are actuated to secure heat sink 224 to load frame 206 and maintain the desired thermal gap. The non-influencing fastener arrangement is shown in more detail in FIGS. 5 and 6. FIG. 5 shows the non-influencing fastener arrangement with non-influencing fastener 220 in an actuated state. FIG. 6 shows non-influencing fastener 220 in a non-actuated state. Non-influencing fastener 220 includes a screw 510 that is threaded into one of the bosses 416 of load frame 206. Captivated on screw 510 are a split taper ring 520 and a solid taper ring 530. Preferably, the taper of split taper ring 520 matches that of solid taper ring 530. Non-influencing fastener 220 is accessible through bore hole 230 in the heat sink's base plate 226, and is actuated by turning screw 510 into the load frame's boss 416 so that split taper ring 520 is expanded against the wall of bore hole 230 in the heat sink's base plate 226. Non-influencing fasteners 220 are advantageous because they can be actuated without significantly altering the thermal interface gap, as would be the case with a conventional fastener.

Figure 8:
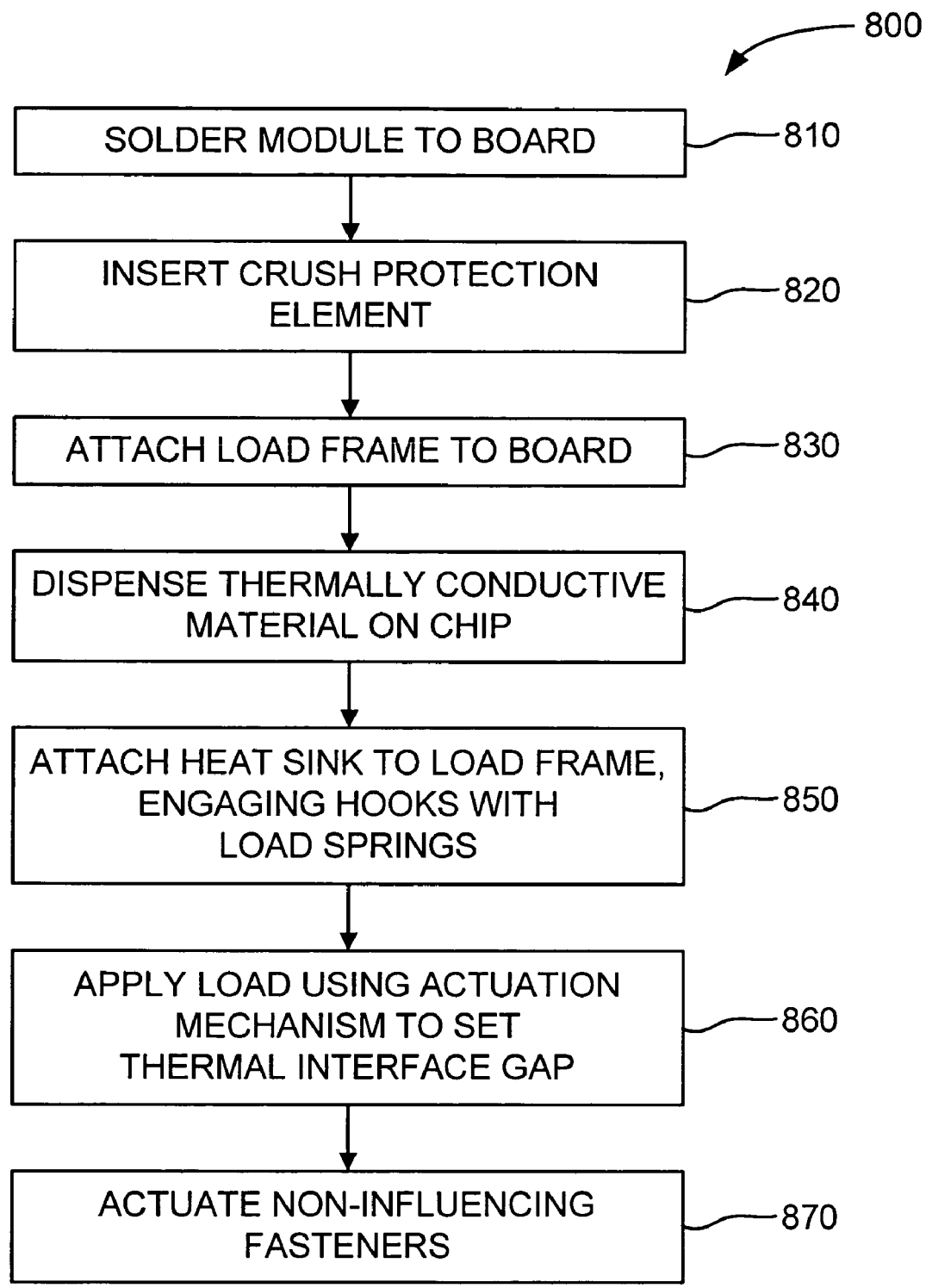
FIG. 8 is a flow diagram of a method for mounting a heat sink in thermal contact with an electronic component according to the preferred embodiments of the present invention.

FIG. 8 is a flow diagram of a method 800 for mounting a heat sink in thermal contact with an electronic component according to the preferred embodiments of the present invention. Method 800 sets forth the preferred order of the steps. It must be understood, however, that the various steps may occur at any time relative to one another. The bare die module is soldered to the printed circuit board (step 810). If a crush protection element is desired, the crush protection element is inserted along peripheral portions of the module substrate between the bottom of module substrate and the top of printed circuit board (step 820). The load frame is attached to the printed circuit board (step 830). Thermally conductive material is dispensed on the semiconductor chip (step 840). Next, the heat sink/load arm assembly is aligned and brought into contact with the load frame/spring assembly (step 850). During step 850, the hook portion of each load arms is brought into engagement with one of the load springs. Method 800 continues with the application of a preload force using the actuation mechanism to set the thermal interface gap (step 860). During step 860, the actuation screw is turned an appropriate amount to apply a preload force (e.g., 40 lbs) that provides the desired thermal interface gap (e.g., 1.2 mil). In other words, some of the thermally conductive material is squeezed-out by the preload force to provide the desired thermal gap. Once this point is reached, the assembly may optionally be thermally cured to set the thermal interface gap. Next, the non-influencing fasteners are actuated to secure the heat sink to the load frame and maintain the desired thermal gap (step 870). Preferably, an appropriate torque is applied to the non-influencing fasteners using an X-pattern sequence to minimize the application of any stresses.

Thermal sensors may be used to measure the thermal interface gap achieved by method 800. If the desired thermal interface gap is not achieved, the unit may be simply reworked by removing the heat sink/load arm assembly from the load frame/spring assembly, and cleaning the thermally conductive material from the semiconductor chip, and returning to step 840.

One skilled in the art will appreciate that many variations are possible within the scope of the present invention. For example, other non-influencing fastener arrangements may be used in lieu of the non-influencing fastener arrangement described above. Moreover, although non-influencing fasteners are preferable, adhesive such as a pressure sensitive adhesive, UV-sensitive adhesive, thermal curing adhesive, epoxy, or any other suitable adhesive may be used in lieu of the non-influencing fasteners described above. Thus, while the present invention has been particularly shown and described with reference to preferred embodiments thereof, it will be understood by those skilled in the art that these and other changes in form and details may be made therein without departing from the spirit and scope of the present invention.

What is claimed is:

1. A heat transfer apparatus comprising:
   a printed circuit board having an electronic component thereon;
   a load frame mounted to the printed circuit board, the load frame having an open region into which the electronic component extends exposing a surface of the electronic component;
   a heat sink disposed on the load frame and having a surface in thermal contact with the surface of the electronic component through a thermally conductive material;
   an actuation mechanism to apply a preload force to the heat sink toward the electronic component to compress the thermally conductive material and achieve a desired thermal interface gap between the surface of the heat sink and the surface of the electronic component; and
   at least one non-influencing fastener disposed within a bore of the heat sink and threaded into the load frame to secure the heat sink to the load frame and maintain the desired thermal interface gap, wherein the at least one non-influencing fastener includes the combination of a screw, a split taper ring, and a solid taper ring, and wherein compression of the rings by turning of the screw into the load frame caused the split taper ring to expand against the bore of the heat sink.

2. A method of assembling a heat transfer apparatus, comprising the steps of:
   attaching a load frame to a printed circuit board having an electronic component thereon, the load frame having an open region into which the electronic component extends exposing a surface of the electronic component;
   dispensing a thermally conductive material on the surface of the electronic component;
   placing a heat sink on the load frame so that a surface of the heat sink is in thermal contact with the surface of the electronic component through the thermally conductive material;
   applying a preload force to the heat sink toward the electronic component to compress the thermally conductive material and achieve a desired thermal interface gap between the surface of the heat sink and the surface of the electronic component; and
   actuating at least one non-influencing fastener disposed within a bore of the heat sink and threaded into the load frame to secure the heat sink to the load frame and maintain the desired thermal interface gap,
   wherein the step of applying a preload force includes the step of turning an actuation screw, and
   wherein the step of actuating at least one non-influencing fastener includes the step of turning a plurality of NIF screws each expanding a split taper ring against the bore of the heat sink, and
   wherein the actuation screw and the NIF screws are accessible and turned from the side of the printed circuit board on which the electronic component resides.

* * * * *